United States Patent
Sutanto et al.

(10) Patent No.: US 7,078,312 B1
(45) Date of Patent: Jul. 18, 2006

(54) METHOD FOR CONTROLLING ETCH PROCESS REPEATABILITY

(75) Inventors: Siswanto Sutanto, San Jose, CA (US);
Wenxian Zhu, Palo Alto, CA (US);
Waikit Fung, Cupertino, CA (US);
Mayasari Lim, Union City, CA (US);
Vishal Gauri, San Jose, CA (US);
George D. Papasouliotis, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 115 days.

(21) Appl. No.: 10/654,113

(22) Filed: Sep. 2, 2003

(51) Int. Cl.
*H01L 21/76* (2006.01)
(52) U.S. Cl. .................... 438/424; 438/435; 438/443; 438/699; 438/402; 438/778; 438/959
(58) Field of Classification Search ................ 438/424, 438/435, 443, 699, 702, 778, 959, FOR. 221, 438/FOR. 227
See application file for complete search history.

(56) References Cited

U.S. PATENT DOCUMENTS

| | | | |
|---|---|---|---|
| 4,361,461 A | 11/1982 | Chang | |
| 5,227,191 A | 7/1993 | Nagashima | |
| 5,246,885 A | 9/1993 | Braren et al. | |
| 5,270,264 A | 12/1993 | Andideh et al. | |
| 5,282,925 A | 2/1994 | Jeng et al. | |
| 5,342,801 A | 8/1994 | Perry et al. | |
| 5,385,857 A | 1/1995 | Solo de Zaldlvar | |
| 5,494,854 A | 2/1996 | Jain | |
| 5,516,729 A * | 5/1996 | Dawson et al. | 438/623 |
| 5,532,516 A | 7/1996 | Pasch et al. | |
| 5,621,241 A | 4/1997 | Jain | |
| 5,622,894 A | 4/1997 | Jang et al. | |
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,789,818 A | 8/1998 | Havermann | |
| 5,851,344 A | 12/1998 | Xu et al. | |
| 5,858,876 A | 1/1999 | Chew | |
| 5,869,902 A | 2/1999 | Lee et al. | |
| 5,872,058 A | 2/1999 | Van Cleemput et al. | |
| 5,897,370 A | 4/1999 | Joshi et al. | |
| 5,910,020 A | 6/1999 | Yamada | |
| 5,911,133 A | 6/1999 | Soble | |
| 5,913,140 A | 6/1999 | Roche et al. | |
| 5,920,792 A | 7/1999 | Lin | |

(Continued)

OTHER PUBLICATIONS

Papasouliotis et al., "Method of Chemical Modification of Structure Topography", U.S. Appl. 10/004,386, filed Dec. 3, 2001.

*Primary Examiner*—George Fourson
*Assistant Examiner*—Michelle Estrada
(74) *Attorney, Agent, or Firm*—Beyer Weaver & Thomas LLP.

(57) ABSTRACT

Plasma etch processes incorporating etch chemistries which include hydrogen. In particular, high density plasma chemical vapor deposition-etch-deposition processes incorporating etch chemistries which include hydrogen that can effectively fill high aspect ratio (typically at least 3:1, for example 6:1, and up to 10:1 or higher), narrow width (typically sub 0.13 micron, for example 0.1 micron or less) gaps while reducing or eliminating chamber loading and redeposition and improving wafer-to-wafer uniformity relative to conventional deposition-etch-deposition processes which do not incorporate hydrogen in their etch chemistries.

22 Claims, 6 Drawing Sheets

U.S. PATENT DOCUMENTS

| | | |
|---|---|---|
| 5,937,323 A | 8/1999 | Orczyk et al. |
| 5,953,635 A | 9/1999 | Andideh |
| 5,962,923 A | 10/1999 | Xu et al. |
| 5,963,840 A | 10/1999 | Xia et al. |
| 5,968,610 A | 10/1999 | Liu et al. |
| 5,972,192 A | 10/1999 | Dubin et al. |
| 6,027,663 A | 2/2000 | Martin et al. |
| 6,030,881 A | 2/2000 | Papasouliotis et al. |
| 6,077,451 A | 6/2000 | Takenaka et al. |
| 6,124,211 A * | 9/2000 | Butterbaugh et al. ....... 438/708 |
| 6,265,269 B1 | 7/2001 | Chen et al. |
| 6,277,764 B1 | 8/2001 | Shin et al. |
| 6,331,494 B1 | 12/2001 | Olson et al. |
| 6,335,261 B1 | 1/2002 | Natzle et al. |
| 6,395,150 B1 | 5/2002 | Van Cleemput et al. |
| 6,479,361 B1 * | 11/2002 | Park .......................... 438/353 |
| 6,479,396 B1 | 11/2002 | Xu et al. |
| 6,500,728 B1 * | 12/2002 | Wang ........................ 438/424 |
| 6,531,377 B1 * | 3/2003 | Knorr et al. ................ 438/435 |
| 6,566,229 B1 * | 5/2003 | Hong et al. ................. 438/435 |
| 6,569,777 B1 | 5/2003 | Hsu et al. |
| 6,596,654 B1 | 7/2003 | Bayman et al. |
| 6,617,207 B1 * | 9/2003 | Kiryu et al. ................ 438/240 |
| 6,642,105 B1 * | 11/2003 | Kim et al. ................... 438/257 |
| 6,867,086 B1 | 3/2005 | Chen et al. |
| 2001/0019903 A1 | 9/2001 | Shufflebotham et al. |
| 2003/0087506 A1 * | 5/2003 | Kirchhoff ................... 438/424 |
| 2004/0058549 A1 | 3/2004 | Ho et al. |

\* cited by examiner

METHOD FOR CONTROLLING ETCH PROCESS REPEATABILITY

BACKGROUND OF THE INVENTION

This invention relates to semiconductor device fabrication processes. More specifically, the invention relates to plasma-based chemical vapor deposition and etch processes for forming dielectric layers, particularly in high aspect ratio, narrow width recessed features.

It is often necessary in semiconductor processing to fill high aspect ratio gaps with insulating material. This is the case for shallow trench isolation, inter-metal dielectric layers, passivation layers, etc. As device geometries shrink and thermal budgets are reduced, void-free filling of narrow width, high aspect ratio spaces (e.g., AR>3:1) becomes increasingly difficult due to limitations of existing deposition processes.

Most deposition methods either deposit more material on the upper region than on the lower region of a side-wall or form cusps at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. The most problematic reentrant feature is a narrowing at the top of the gap; the etched side-walls slope inward near the top of the gap. For a given aspect ratio feature, this increases the ratio of gap volume to gap access area seen by the precursor species during deposition. Hence voids and seams become even more likely.

The deposition of silicon dioxide assisted by high-density plasma chemical vapor deposition (HDP CVD)—a directional (bottom-up) CVD process—has become the preferred method for high aspect ratio gap fill. The method deposits more material at the bottom of a high aspect ratio structure than on its sidewalls. It accomplishes this by directing charged dielectric precursor species downward, to the bottom of the gap. Thus, HDP CVD is not an entirely diffusion-based (isotropic) process.

A gap fill technique which involves a sequence of deposition, etch and deposition steps using an HDP reactor has been developed to maintain the cusp opening wide enough for a subsequent deposition(s) to completely fill the gap. Such HDP deposition-etch-deposition ("dep-etch-dep") processes are described, for example, in U.S. Pat. Nos. 6,335,261 and 6,030,881, the disclosures of which are incorporated herein by reference for all purposes.

The etch component of these dep-etch-dep processes typically uses a fluorine-based etchant, in particular $NF_3$, and is isotropic. The etch process is susceptible to a "loading effect," such that etch process response on each successive wafer processed in a reactor is a function of the loading condition of the reactor. "Loading," in this instance, refers to gap fill material that builds up on chamber components, particularly the chamber sidewalls, over successive deposition processes. This "loading effect" phenomena leads to a wafer-to-wafer process repeatability issue with dep-etch-dep processes thus limiting the proliferation of this technique despite its superior gap fill capability.

Accordingly, a dep-etch-dep process with wafer-to-wafer repeatability and without a redeposition or loading effect problem would be desirable.

SUMMARY OF THE INVENTION

The present invention addresses this need by providing plasma etch processes incorporating etch chemistries which include hydrogen. In particular, the invention provides high density plasma chemical vapor deposition-etch-deposition processes incorporating etch chemistries which include hydrogen that can effectively fill high aspect ratio (typically at least 3:1, for example 6:1, and up to 10:1 or higher), narrow width (typically sub 0.13 micron, for example 0.1 micron or less) gaps while reducing or eliminating chamber loading and redeposition and improving wafer-to-wafer uniformity relative to conventional deposition-etch-deposition processes which do not incorporate hydrogen in their etch chemistries.

This deposition part of the process may involve the use of any suitable high density plasma chemical vapor deposition (HDP CVD) chemistry, including those with hydrogen and dopant precursors in the reactive mixture.

The etch back part of the process involves an inductively coupled plasma etch using isotropic chemistry including hydrogen and a fluorine based etchant.

Suitable plasma reactors with inductively coupled plasma (ICP) sources are available to accomplish both of these deposition and etch techniques in a single plasma reactor chamber. Conducting all deposition and etch processes in a single plasma reactor chamber increases throughput and reduces handling of wafers resulting in more efficient and higher quality gap fill operations.

In one aspect, the invention pertains to a method of filling gaps on a semiconductor substrate. The method involves partially filling a gap on a semiconductor substrate with dielectric using a high density plasma chemical vapor deposition process, partially removing dielectric deposited in the gap from the gap opening by an etch back process conducted with process chemistry including hydrogen, and further filling of the partially filled gap by HDP CVD.

In another aspect, the invention pertains to a method of etching and minimizing the redeposition of gapfill materials on a partially filled gap on a semiconductor substrate. The method involves partially removing dielectric deposited in the gap from the gap opening by an etch back process and reducing the film removal from the chamber wall conducted with process chemistry including hydrogen.

In another aspect, the invention pertains to a method of filling gaps on a plurality of semiconductor wafers. The method involves providing a series of like semiconductor wafers to a plasma reactor process chamber, and filling a like gap on each of the semiconductor wafers with a dielectric using alternating high density plasma chemical vapor deposition and etch back processes in which wherein the wafer-to-wafer process repeatability is maintained.

In preferred embodiments of the present invention, the deposition and etch processes are conducted in a single plasma reactor chamber for all wafers processed.

These and other features and advantages of the present invention are described below where reference to the drawings is made.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention relates to chemical vapor deposition and etch back processes that can fill high aspect ratio (typically at least 3:1, for example 6:1, and up to 10:1 or higher), narrow width (typically sub 0.13 micron, for example 0.1 micron or less) gaps on semiconductor wafers using plasma etch chemistries which include hydrogen. In particular, the invention provides high density plasma chemical vapor deposition-etch-deposition processes incorporating etch chemistries which include hydrogen.

The invention is generally implemented in the context of a deposition-etch-deposition (dep-etch-dep) gap fill process. The deposition part of the process may involve the use of any suitable high density plasma chemical vapor deposition (HDP CVD) chemistry, including those with hydrogen and dopant precursors in the reactive mixture. The etch back part of the process involves a substantially isotropic dry etch conducted using a plasma etch chemistry which includes hydrogen. This etch back part of the process may involve any suitable substantially isotropic dry etch technique, for example a downstream microwave plasma or inductively coupled plasma (ICP) etch, using isotropic chemistry. Suitable plasma reactors with inductively coupled plasma (ICP) sources are available to accomplish these deposition and etch techniques in a single reactor chamber.

A process in accordance with the present invention can effectively fill high aspect ratio gaps while reducing or eliminating chamber loading and redeposition and improving wafer-to-wafer uniformity relative to conventional deposition-etch-deposition processes which do not incorporate hydrogen in their etch chemistries. Also, the ability to obtain good wafer-to-wafer uniformity while conducting the entire dep-etch-dep process in a single plasma reactor chamber increases throughput and reduces handling of wafers resulting in more efficient and higher quality gap fill operations.

Deposition-Etch-Deposition Process

Figure 1A:
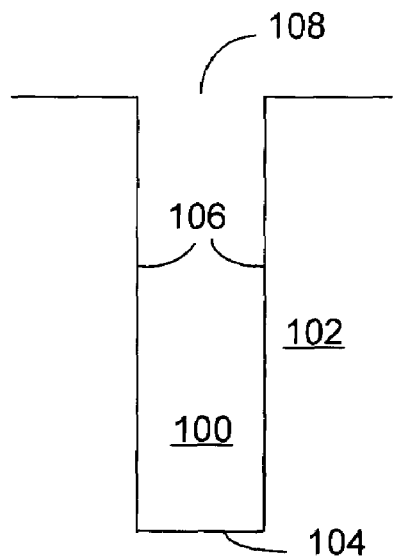
FIGS. 1A–D depict rough schematic cross-sectional diagrams of a deposition-etch-deposition gap fill process in accordance with the present invention.

FIGS. 1A–D depict rough schematic cross-sectional diagrams of a multi-step (dep-etch-dep) gap fill process in accordance with the present invention. FIG. 1A depicts a trench (gap) 100 on a semiconductor substrate 102 requiring filling with a dielectric. The gap may be defined by its features, namely its bottom 104, sidewalls 106 and entry region (top) 108. The gap 100 is generally lined with a barrier layer, such as silicon nitride. As such, a thin layer (e.g., 10–200 Å, for example 100 Å) of silicon nitride is formed on the gap bottom 104 and sidewalls 106 prior to being filled with bulk dielectric. A pad nitride also generally exists at the entry region 108, on the substrate surface surrounding the gap 100.

The present invention, while applicable to the filling of any gap requiring dielectric fill, is particularly suited to gap fill of high aspect ratio, narrow width gaps. For example, the gap 100 may have a high aspect ratio, for example about 6:1 and a narrow width, for example about 1000 Å.

Figure 1B:
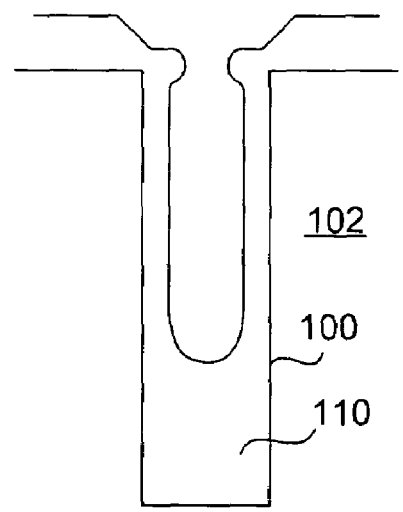

In an initial step in a multi-step gap fill process in accordance with the present invention, the gap 100 is partially filled with a dielectric 110 deposited by high density plasma (HDP) chemical vapor deposition (CVD) process, as shown in FIG. 1B. Generally, a high density plasma is any plasma having electron density of at least about $1 \times 10^{12}$ electrons per cubic centimeter. Typically, though not necessarily, high density plasma reactors operate at relatively low pressures, in the range of 100 mTorr or lower. The HDP CVD deposition results in beneficial filling of the trench from the bottom 104 up. However, as described above, there is still some problematic top and sidewall deposition resulting in an overhang (cusp) 112 at the entry region 108 of the gap 100. This results from the non-directional deposition reactions of neutral species in the plasma reactor and from sputtering/redeposition processes. Limitations due to overhang formation become ever more severe as the width of the gap to be filled decreases, the aspect ratio increases, and the features become reentrant.

The deposition process gas will have a particular composition represented by flow rates of the constituent gases in units of standard cubic centimeter per minute (sccm). The process gas will include a precursor for the deposition layer. If the dielectric is a silicon-containing dielectric, then the process gas will include a silicon-bearing compound such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (tri-methylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

The process gas will also generally include a carrier gas. The carrier gas may be an inert gas, such as He, Ar and/or other noble gases. Or the carrier gas may be or include elemental or molecular hydrogen.

Oxygen to form the silicon oxide or other dielectric material may be provided by the silicon-containing precursor itself or from another process gas such as elemental oxygen ($O_2$), nitric oxide (NO), and/or nitrous oxide ($N_2O$).

Typical flow rate ranges for process gases of the present invention are listed below.

| Gas | Flow Rate (sccm) |
| --- | --- |
| $SiH_4$ | 10–300 |
| $O_2$ | 20–1000 |

-continued

| Gas | Flow Rate (sccm) |
|---|---|
| He | 0–500 |
| $H_2$ | 0–5000 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 150 sccm.

Note also that the presence of hydrogen in the process gas may require that the ratio of oxygen containing precursor to silicon-containing precursor be adjusted upward (in comparison to a standard hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 200 sccm based on a 200 millimeter substrate. Larger substrates require higher flow rates. The flow rate may vary somewhat when special injector configurations are employed.

The invention is also practiced with process gases containing noble gas (e.g., argon, helium, or xenon), with helium being preferred, either as the sole carrier gas, or in a mixture with hydrogen. The use of noble gases can be practiced under the conditions of the above-described embodiments, and their flow rate can be used in order to modulate the effect of other process gas components (e.g., hydrogen) on the deposition profile of the deposited oxide film.

For doped dielectrics (particularly silicon dioxide based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, NO, $N_2O$, and mixtures thereof.

The method applies as well to the deposition (biased or unbiased) of carbon-doped silicon oxide from process gas mixtures including organosilanes (e.g., TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethyl-silane), TMDSO (tetramethyl-disiloxane), TMDDSO (tetramethyl-diethoxyl-disiloxane), DMDMS (dimethyl-dimethoxyl-silane) and mixtures thereof).

In preferred embodiments, the deposited dielectric is a silicon oxide such as silicon dioxide ($SiO_2$), silicon oxynitride (SiON), silicon oxyfluoride (SiOF), or doped variants of silicon oxide glass such as silicon nitride ($Si_3N_4$), fluorine (FSG), phosphorus (PSG) and boron-doped silicon oxide glass (BPSG).

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 450° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the induction coil typically varies from 1 kW to 20 kW, and the high frequency power (for biasing the wafer) typically varies from 0.5 kW to 10 kW depending on the substrate size (e.g., 200 or 300 mm diameter) and the requirements of the specific process being used.

The power source applied to the induction coil and substrate electrode is typically a radio frequency source. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The power source applied to the induction coil typically has a frequency range between about 300 kHz and 1 MHz. In a preferred embodiment, the deposition process chemistry is as follows:

| Gas | Flow Rate (sccm) |
|---|---|
| $SiH_4$ | 60 |
| He | 100 |
| $H_2$ | 100 |
| $O_2$ | 78 |

The low frequency coil is powered at 3000 W and the high frequency substrate electrode is powered at 800 W. Further details of suitable HDP CVD deposition process gas chemistries are provided below.

Following this initial deposition stage of the process, the detrimental overhang 112 formed at the top of the trench during the deposition stage is removed in an etch back stage of the process to facilitate further void free filling of the trench. In a preferred embodiment, the etch back process is carried out in the same reactor chamber as the deposition.

Figure 1C:
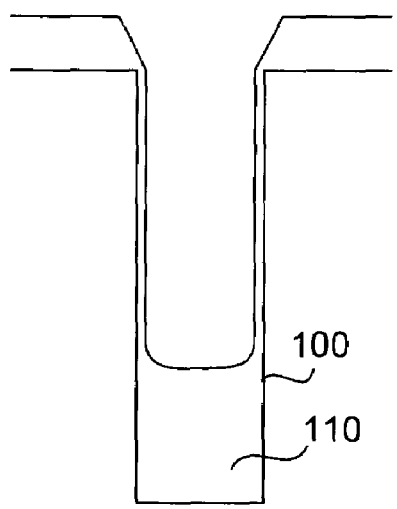

In the etch back process, the wafer is processed under substantially isotropic conditions. For example, the wafer is exposed to a radio frequency based inductively coupled plasma containing fluorine etchant chemistries, for example $NF_3$, and hydrogen may be used. This step removes dielectric from the gap 100 resulting in removal of the overhang 112 and widening of the gap 100, thus reducing the aspect ratio of the partially filled gap, as illustrated in FIG. 1C, and facilitating further filling of the gap by subsequent HDP CVD dielectric deposition.

The etch stage is a substantially isotropic process. For example, an inductively coupled $NF_3$ and $H_2$-based plasma is maintained with 4.5 kW of source power. The etch is described as "substantially" isotropic because it is conducted using a plasma source and etchant chemistry that impart an isotropic character to the etch. However, the chuck may be biased or unbiased, for example with a power range of about 0–5000 W. In some preferred embodiments, the chuck is biased with about 500–2000 W. Biasing the chuck imparts some directionality to the etch plasma towards the wafer on the biased chuck. Thus, while the etch process of the present invention has a dominant isotropic character, it does favor the wafer when a bias is applied to the chuck holding the wafer. The etch process is referred to herein as substantially isotropic.

The etch plasma chemistry includes a fluorine (F)-containing etchant compound. Suitable examples include $NF_3$, $CF_4$, $C_2F_6$, $CHF_3$ and $SF_6$. $NF_3$ is a preferred etchant in some embodiments. The etch chemistry also includes hydrogen ($H_2$). In addition, the etch plasma chemistry includes an inert carrier gas, which may be He, Ar or $N_2$, with He being preferred. $O_2$ may optionally be included in the etch chemistry, but should only be used to the extent necessary to achieve plasma stability.

An $H_2$/He/$NF_3$-based chemistry is preferred in one embodiment of the invention. Typical process parameter ranges for inductively coupled plasma process gases in accordance with the present invention and reactor conditions are listed as follows:

| | |
|---|---|
| Wafer temp (° C.) | 250–700 |
| $NF_3$ (sccm) | 50–1000 |
| $H_2$ (sccm) | 50–2000 |
| He (sccm) | 50–1000 |

-continued

| | |
|---|---|
| $O_2$ (sccm) | 0–500 |
| Pressure (mTorr) | 0.2–100 |
| Bias (HF RF) Power (W) | 0–5000 |
| Source (LF) Power (W) | 2000–8000 |

In a preferred embodiment, the etch process chemistry and reactor conditions are as follows:

| | |
|---|---|
| Wafer temp (° C.) | 350–650 |
| $NF_3$ (sccm) | 100–200 |
| $H_2$ (sccm) | 50–750 |
| He (sccm) | 50–200 |
| $O_2$ (sccm) | 0–200 |
| Pressure (mTorr) | 0.5–20 |
| Bias (HF RF) Power (W) | 500–2000 |
| Source (LF) Power (W) | 2000–5000 |

The $H_2/NF_3$ gas flow ratio is preferably from about 1:1 to about 15:1, depending upon the high frequency and low frequency (LF/HF) power settings. In one specific preferred embodiment, a $H_2/NF_3$ gas flow ratio is about 5:1 is used.

The conditions are preferably set so that the etch is selective for the HDP CVD deposited dielectric (e.g., $SiO_2$) relative to the silicon nitride barrier layer lining the trench. Adjustment of the process selectivity is within the skill in the art given the process parameters and description provided herein.

Figure 1D:
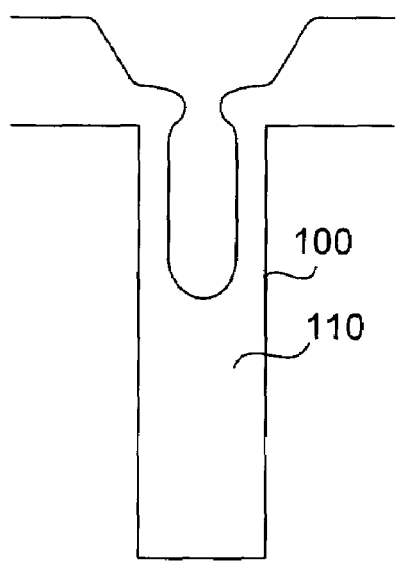

Following the etch back stage, an additional HDP CVD deposition is performed in order to further fill the gap 100 with dielectric 110, as shown in FIG. 1D. The etch back and deposition steps depicted in FIGS. 1C and D are then repeated until the gap is filled. For a gap with about a 6:1 aspect ratio and about a 1000 Å width, three to five, for example four, iterations of the etch back and deposition steps are typical to obtain void free filling of the gap. The wafer with the filled gap is then removed from the reactor chamber and another like wafer is inserted for the dep-etch-dep gap fill processing. In this way, a plurality of wafers may be gap fill processed with good wafer-to-wafer uniformity.

Figure 3A:
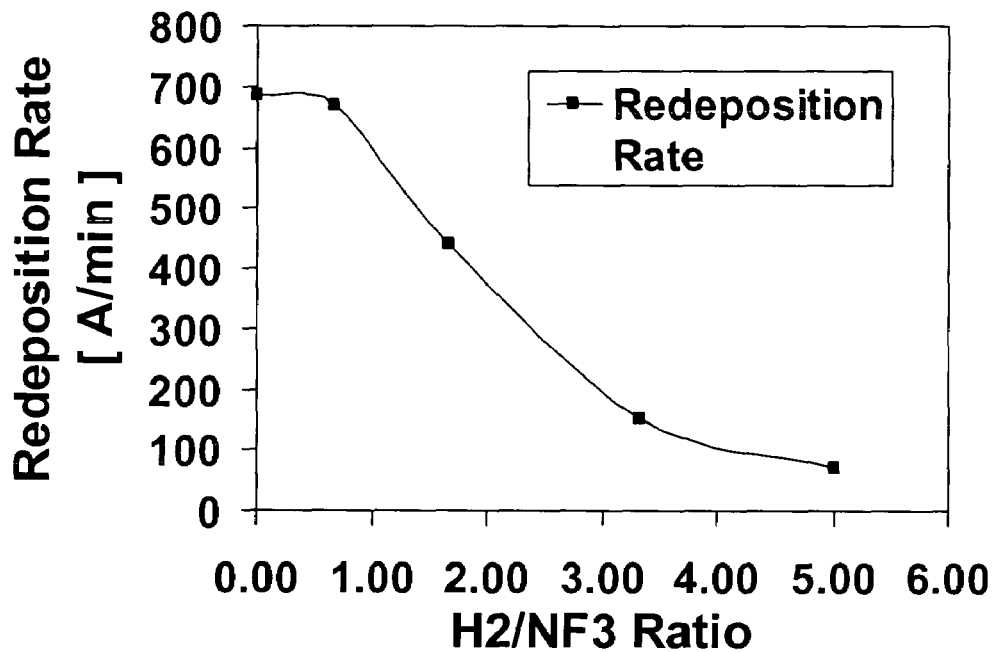

Without limiting the invention described and claimed herein, some beneficial effects of the addition of hydrogen to the etch chemistry in accordance with the present invention are illustrated with reference to FIGS. 3A and B, 4A and B, and 5A and B, which plot data generated using the following process chemistries and reactor conditions:

| | Dep | Etch |
|---|---|---|
| SiH4 (sccm) | 60 | 0 |
| O2 (sccm) | 78 | 100 |
| NF3 (sccm) | 0 | 150 |
| He (sccm) | 400 | 100 |
| H2 (sccm) | 0 | 0–750 |
| LF (W) | 3000 | 2200–3500 |
| HF (W) | 1000 | 1000–2000 |
| SDT (s) | 90 | 60 |

As noted above, conventional etch processes in dep-etch-dep contexts have been susceptible to a "loading effect,"

such that etch process response on each successive wafer processed in a reactor is a function of the loading condition of the reactor chamber. "Loading," in this instance, refers to gap fill material that builds up on chamber components, particularly the chamber sidewalls, over successive deposition processes. This "loading effect" phenomena leads to a wafer-to-wafer process repeatability issue with dep-etch-dep processes.

Without limiting the invention, the mechanism that causes this "loading effect" is believed to be film redeposition from the reactor chamber wall to the wafer surface during the etch stage of the gap fill process. During etching, fluorine ions etch all the exposed surfaces in the reactor chamber, including the surface of the wafer and chamber wall. Absent a cleaning step, such as an RF clean, in a subsequent deposition stage, film thickness on the reactor chamber wall will increase. As a result, the amount of redeposited material coming from etching of the chamber walls will also increase until the redeposition rate of the materials reaches an equilibrium with the chamber thickness. Wafer etch rate is adversely impacted by this redeposition, such that the etch rate of subsequent wafer will be lower until redeposition reaches the saturation point.

It is known that hydrogen passivates fluorine by reacting with fluorine ions in the plasma activated environment to form hydrofluoric acid (HF) as shown in the following equation:

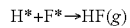

However, the selectivity of hydrogen ions reacting with fluorine ions, its dependence on ion bombardment energy flux (IBEF) and its effect on redeposition and the "loading effect" has not been fully explored. It is now believed that redeposition of gap fill material, characterized by its redeposition rate, is a function of ion energy flux and hydrogen passivation, and that hydrogen pasivation becomes less efficient with higher ion energy flux. Since increasing HF bias or LF source power increases the wafer etch rate due to an increase in ion energy flux towards the wafer, but also increases redeposition rate, a higher $H_2/NF_3$ ratio in the etch chemistry is required in order to minimize the redeposition effect.

Thus, it has been found that the addition of hydrogen to the etch chemistry of a dep-etch-dep process relieves the loading effect problem. By adding hydrogen flow in the etch step in dep-etch-dep process, the redeposition effect is minimized thus reducing the loading effect in subsequent processing stages. Note that this invention is not limited to any particular mechanism of deposition or etch back action.

Figure 2A:
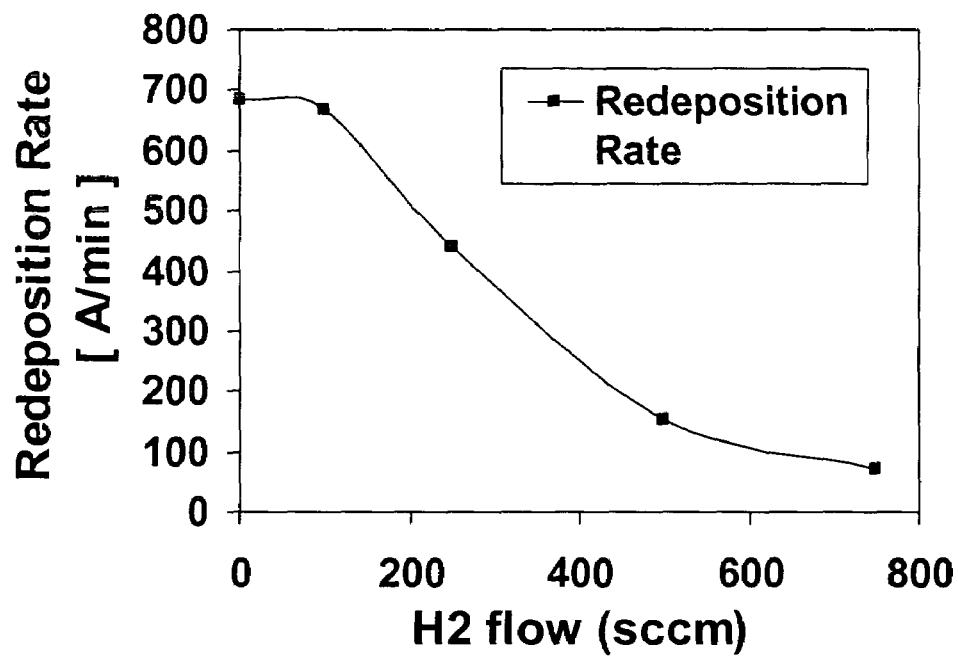
FIGS. 2A–B, 3A–B, 4 and 5 are plots of data illustrating characteristics of hydrogen-containing etch chemistries in accordance with the present invention.
Figure 2B:
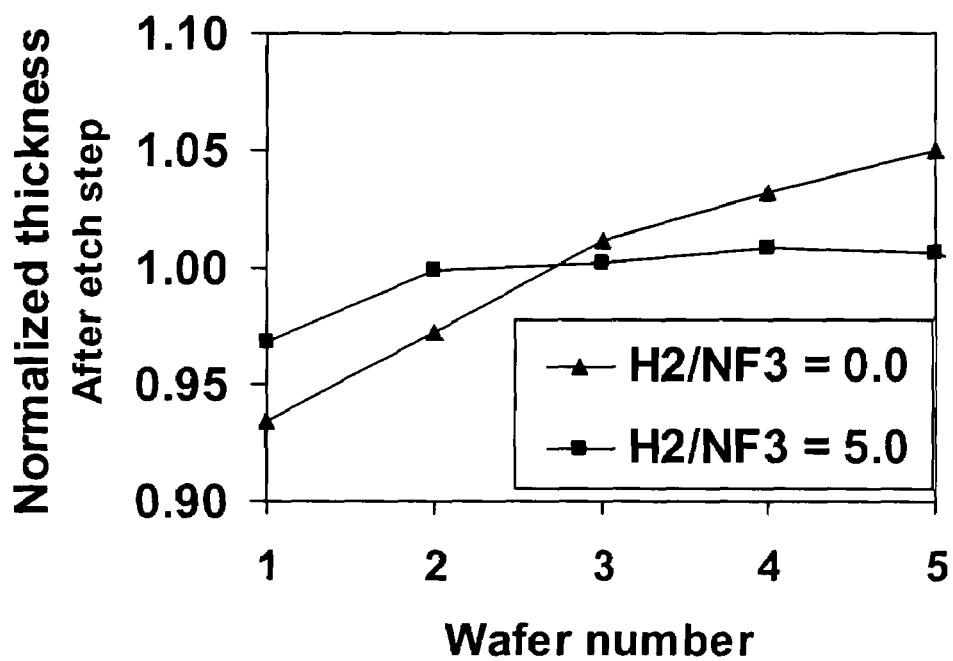
Figure 3B:
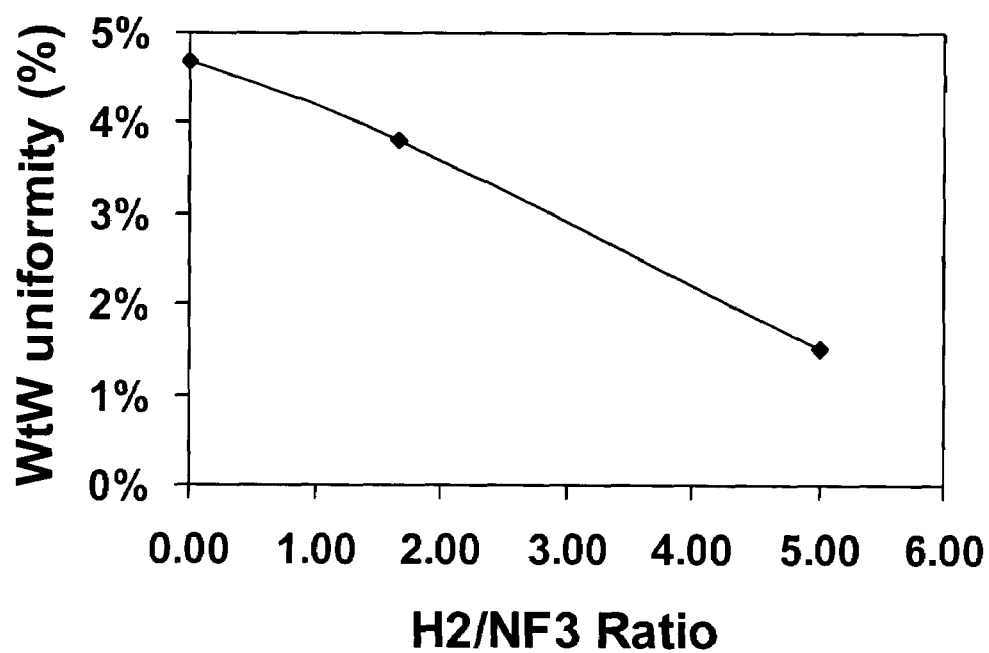

FIGS. 2A and B show the effect hydrogen flow on redeposition and loading effect. FIG. 2A shows that the redeposition rate is reduced significantly with subsequent increase in hydrogen flow. In FIG. 2B, the loading effect is also shown to be reduced significantly as illustrated by a leveling of the normalized deposition thickness following the first wafer for the $H_2/NF_3$ ratio of 5.0 as compared to a steady increase for the hydrogen free etch chemistry ($H_2/NF_3$ ratio of 0.0). By adjusting the $H_2/NF_3$ ratio, the redeposition rate and WtW uniformity can be controlled and reduced. FIG. 3A shows the effect of increasing $H_2/NF_3$ ratio to redeposition rate and WtW uniformity. FIG. 3B shows that with an increase in $H_2/NF_3$ ratio the redeposition rate decreases and WtW uniformity improves, reducing from about 4.7% 1σ to <2% 1σ.

Figure 4:
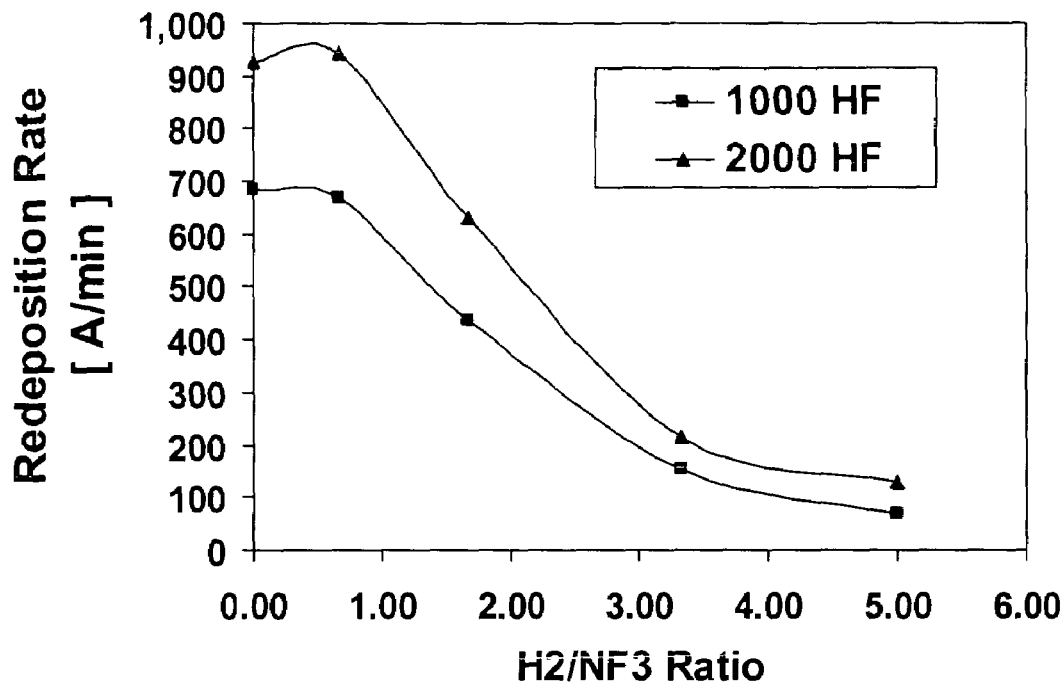
Figure 5:
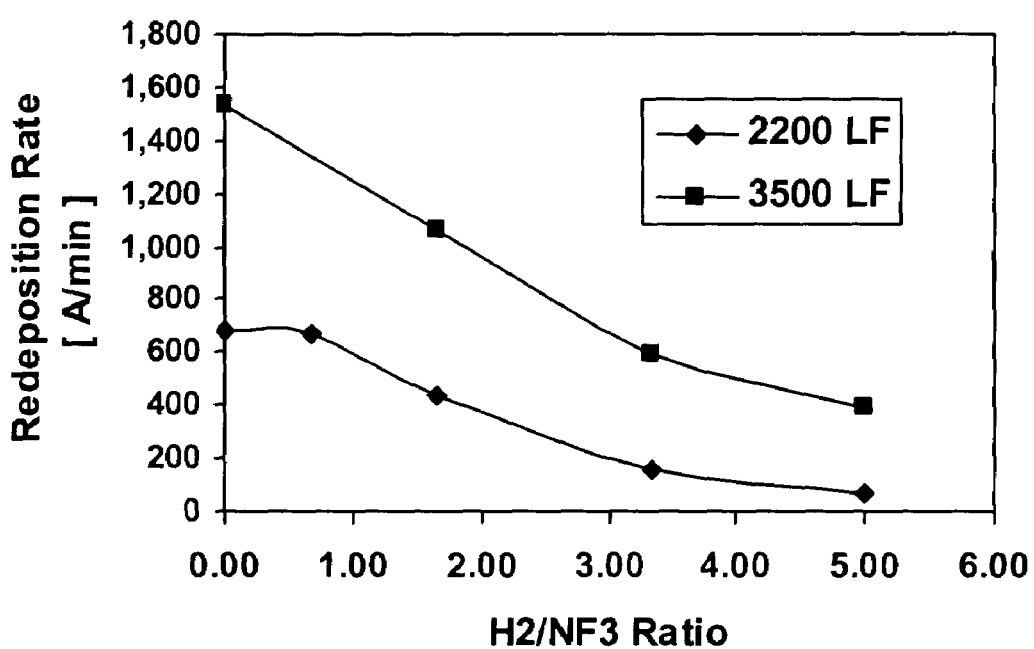

FIGS. 4 and 5 show the effect of hydrogen flow on redeposition rate at different HF bias and LF source power levels. The data show that hydrogen passivation becomes less efficient as power is increased, so that a relatively higher $H_2/NF_3$ ratio is needed in order to minimize the redeposition at higher power levels.

Implementation: Plasma Processing Reactor

Various plasma reactor designs are suitable for use with this invention. The particular design is not critical to this invention. It merely needs to support HDP CVD dielectric layer formation and etch back on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes or radio frequency power source coupled to an induction coil to generate an inductively coupled plasma, and a bias source for the substrate. A temperature control system is typically used to heat the substrate. Suitable plasma processing reactors and described, for example, in U.S. Pat. Nos. 5,346,578, 5,405,480 and 5,605,599, the disclosures of which are incorporated by reference herein in their entirety and for all purposes.

Figure 6A:
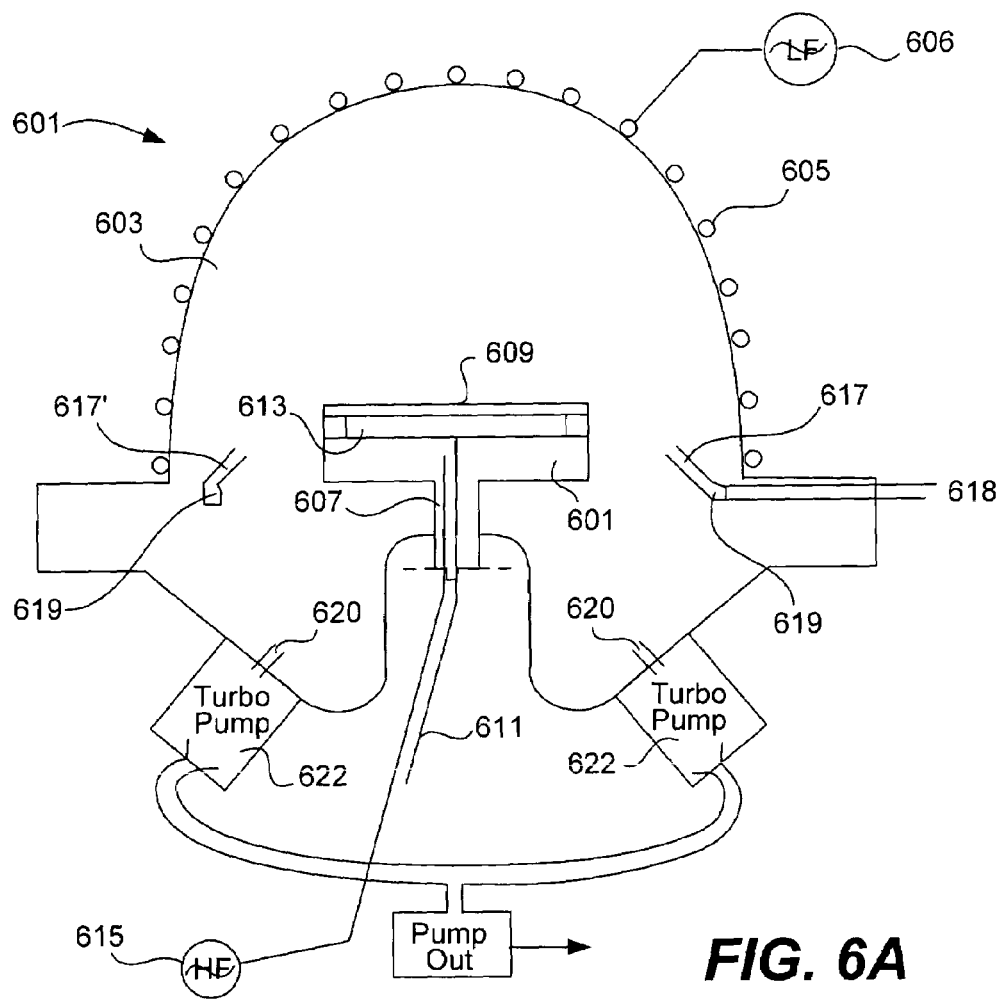
FIG. 6A is a vertical cross-sectional block diagram depicting some components of a plasma processing system suitable for conducting a dep-etch-dep gap fill process in accordance with the present invention.

FIG. 6A is a vertical cross-section block diagram depicting some components of a suitable plasma processing reactor suitable for conducting a dep-etch-dep gap fill process in accordance with the present invention on semiconductor wafers. As shown, the reactor 601 includes a process chamber 603 which encloses other components of the reactor and serves to contain the plasma generated by the radio frequency power source coupled to the induction coil 605 which surrounds the chamber on or embedded in the chamber walls. In one example, the process chamber walls are made from aluminum, aluminum oxide, and/or other suitable material. The coil 605 is powered by a "low frequency" radio frequency (RF) source 606. The power and frequency supplied by source 606 is sufficient to generate high-density plasma from the process gas.

Within the reactor, a wafer pedestal 607 supports a substrate 609. The pedestal typically includes a chuck 608 to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer gas controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition or etch reactions. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate with a power ranges from 0.5 kW to 10 kW.

Figure 6B:
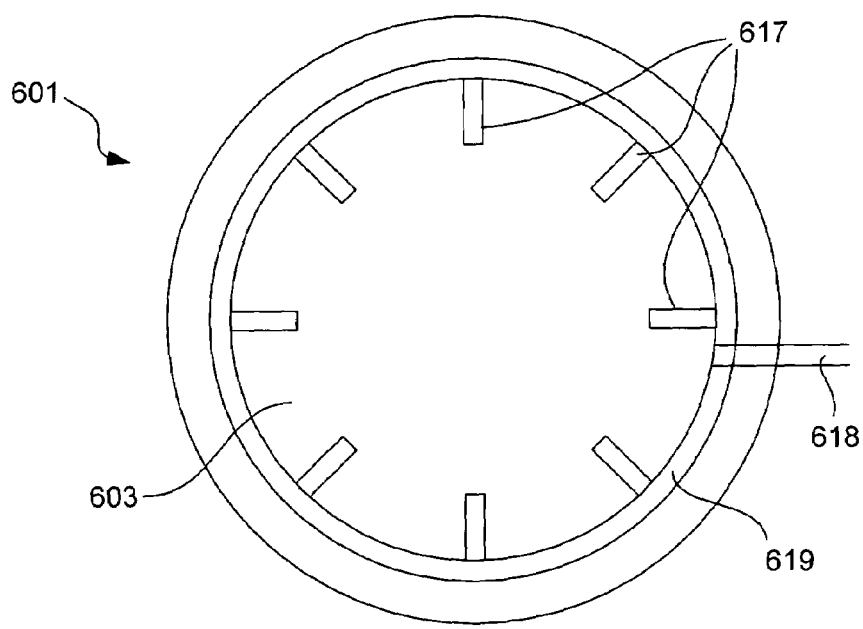
FIG. 6B is a horizontal cross-section schematic diagram of the plasma processing system of FIG. 6A.

The process gases are introduced via one or more chamber inlets 617. The gases may be premixed or not. A source of hydrogen gas provides hydrogen for the process gas. Other sources of dielectric precursor gases, etchant gases and carrier gases are also provided. Preferably, the process gas is introduced through a gas supply inlet mechanism including orifices. The gas or gas mixture may be introduced from a primary gas ring, which may or may not direct the gas toward the substrate surface. In this embodiment, a ring inlet(s) 618 is connected to the primary gas ring 619 to supply gas or gas mixture into the chamber via the chamber inlets 617. This arrangement is further illustrated in the horizontal cross-section of FIG. 6B which depicts a ring inlet and eight chamber inlets for process gas. Note that inlets, gas rings or other mechanisms for supplying process gas to the reactor process chamber are not critical to this invention. The sonic front caused by the gas entering the chamber will itself cause the gas to rapidly disperse in all directions—including toward the substrate.

The process gas exits the chamber 603 via an outlet or outlets 620. A vacuum pump (e.g., a turbomolecular pump) or pumps 622 typically draws the gas out and maintains a suitably low pressure within the reactor.

Process Parameters

Figure 7:
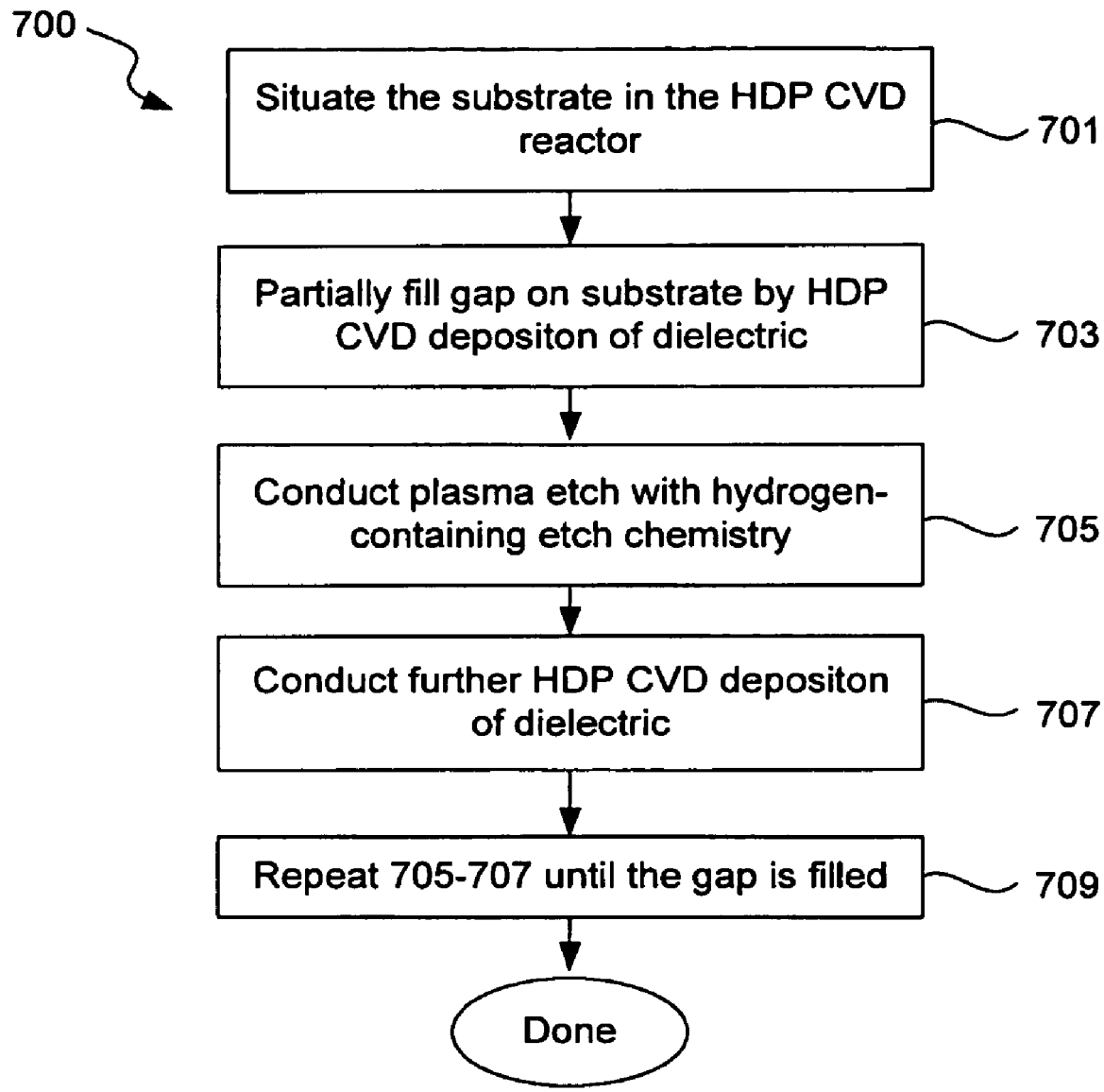
FIG. 7 is a process flow diagram depicting a process context of the present invention.

FIG. 7 is a process flow diagram (700) depicting a process context of the present invention. Reference is made to the system depicted in FIG. 6A throughout the description of this process flow as a sample context for implementation of the invention. A substrate requiring gap filling, such as a semiconductor wafer, is situated in an HDP CVD reactor (701).

A deposition process begins with an electrical subsystem applying electrical energy of appropriate power and frequency to one or more electrodes of a process chamber of the reactor. The power and frequency are chosen to generate a high density plasma in the chamber, given the process gas concentration, pressure, and other process parameters. Providing the substrate to the reactor may involve clamping the substrate to a pedestal or other support in the chamber. For this purpose, an electrostatic or mechanical chuck may be employed.

After the wafer is appropriately situated in the chamber, a gap on the substrate is partially filled by HDP CVD deposition of dielectric (703). The process adjusts the substrate temperature to a level promoting the deposition of the dielectric layer. Typically, this temperature is between about 30–1000° C. (more preferably about 300 to 680° C., for example 450–550° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation.

The reactor system introduces a process gas to the reaction chamber via an inlet. The process gas includes dielectric precursor species such as high vapor pressure silicon-containing compounds, and optionally one or more dopant precursors, such as the phosphorus precursor phosphine ($PH_3$). Molecular oxygen or another oxygenated compound will often be present. A carrier gas is also generally present. The carrier gas may be an inert carrier gas such as helium. However, in high aspect ratio gap fill applications the carrier gas preferably is or includes molecular or elemental hydrogen which inhibits precursor dissociation and promotes bottom-up gap fill. All the process gas components are introduced at specified flow rates.

An electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency RF bias and the induction coil is powered by a lower frequency RF source.

Dielectric is deposited in the gap or gaps on the substrate to a desired thickness, generally at the point where the overhang that forms at the gap entry point prevents further effective filling of the gap (703).

After finishing the deposition step, the flow of deposition chemistry is turned off and the isotropic etchant chemistry is introduced to the reaction chamber via an inlet. The etchant process gas should dissociate at a controlled rate consistent with isotropic etching and provide uniform etching of the dielectric (705). An $NF_3/H_2$/He-based chemistry is typically used. Other fluorinated gases, e.g., $SF_6$ or $NF_3$ may be used. Molecular oxygen may also be present in the etchant chemistry, but should be minimized. All the process gas components are introduced at specified flow rates within the parameters noted above. In a preferred embodiment, the isotropic etch is conducted using an inductively coupled plasma source in the reactor The RF bias power applied to the substrate in the reactor is adjusted to between about 500 and 2000 W. It should be noted that the inductively coupled plasma (ICP) etch may alternatively be accomplished by a downstream microwave plasma etch. The etch back process removes dielectric in the gap(s) widening the remaining gap thereby decreasing its aspect ratio and facilitating is further filling in subsequent deposition processing.

Following the etch, etch process chemistry flows are turned off and further deposition process for filling the remaining gap is performed (707) by introducing the deposition process gases into the reactor. The etch back and deposition process (705–707) is then repeated until the gap is filled (709). For a gap with about a 6:1 aspect ratio and about a 1000 Å width, three to five, for example four, iterations of the etch back and deposition steps are typical to obtain void free filling of the gap.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation (STI), pre-metal dielectric (PMD), inter-metal layer dielectric (ILD) layers, passivation layers, etc.

As indicated, the invention can effectively fill gaps having widths of 0.15 microns or less, for example 0.1 micron or less, and aspect ratios of 3:1 or greater, for example 5:1, 6:1, or even 10:1 or greater. More aggressive structures having, e.g., greater aspect ratios and smaller widths may also be used. In one example the gap width is 0.15 micrometers or less, e.g., between 0.13 and 0.1 micrometers.

The dielectrics employed to fill those gaps will often be a silicon oxide such as silicon dioxide, silicon oxynitride, silicon oxyfluoride, and doped variants of each of these. Therefore, the scope of the invention includes at least phosphorus-doped, boron/phosphorus-doped oxides and fluorine/phosphorus-doped oxides. As indicated, the dielectric may also be a phosphorus- and boron-doped silicon oxide glass (BPSG).

CONCLUSION

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a semiconductor substrate, the method comprising:
   (a) partially filling a gap on a semiconductor substrate with a dielectric using a high density plasma chemical vapor deposition process;
   (b) partially removing dielectric deposited in the gap from the gap opening by a plasma etch back process conducted with process chemistry comprising a fluorine (F)-containing etchant compound and hydrogen ($H_2$); and
   (c) further filling of the partially filled gap by a high density plasma chemical vapor deposition process.

2. The method of claim 1, wherein (b) and (c) are repeated until the gap is filled.

3. The method of claim 1, wherein (b) comprises a substantially isotropic plasma etch.

4. The method of claim 1, wherein the deposition and etch steps are conducted in a single plasma reactor process chamber.

5. The method of claim 4, wherein the plasma generated for deposition and etch is a radio frequency based inductively coupled plasma (ICP).

6. The method of claim 5, wherein the reactor process chamber is maintained at a pressure of about 0.2–100 Torr for the etch.

7. The method of claim 5, wherein the substrate is held by a chuck in the reactor process chamber that is maintained at a temperature of between about 250 and 700° C.

8. The method of claim 7, further comprising biasing the chuck in the reactor chamber during the etch back processing.

9. The method of claim 1, wherein the fluorine (F)-containing etchant compound is selected from the group consisting of $NF_3$, $CF_4$, $C_2F_6$, $CHF_3$ and $SF_6$.

10. The method of claim 9, wherein the etch plasma chemistry further comprises an inert gas selected from the group consisting of He, Ar and $N_2$.

11. The method of claim 10, wherein the etch plasma chemistry further comprises $O_2$.

12. The method of claim 10, wherein the etch plasma chemistry comprises $NF_3$ and He.

13. The method of claim 1, wherein the etch is conducted using plasma process chemistry and reactor conditions as follows:

| | |
|---|---|
| Wafer temp (° C.) | 250–700 |
| $NF_3$ (sccm) | 50–1000 |
| $H_2$ (sccm) | 50–2000 |
| He (sccm) | 50–1000 |
| $O_2$ (sccm) | 0–500 |
| Pressure (mTorr) | 0.2–100 |
| Bias (HF RF) Power (W) | 0–5000 |
| Source (LF) Power (W). | 2000–8000 |

14. The method of claim 13, wherein the etch is conducted using plasma process chemistry and reactor condition as follows:

| | |
|---|---|
| Wafer temp (° C.) | 350–650 |
| $NF_3$ (sccm) | 100–200 |
| $H_2$ (sccm) | 50–750 |
| He (sccm) | 50–200 |
| $O_2$ (sccm) | 0–200 |
| Pressure (mTorr) | 0.5–20 |
| Bias (HF RF) Power (W) | 500–2000 |
| Source (LF) Power (W). | 2000–5000 |

15. The method of claim 14, wherein the $H_2/NF_3$ gas flow ratio is about 5:1.

16. The method of claim 1, wherein the deposited dielectric is a silicon oxide selected from the group consisting of silicon dioxide ($SiO_2$), silicon oxynitride (SiON), silicon oxyfluoride (SiOF) and doped variants of silicon oxide glass selected from the group consisting of silicon nitride ($Si_3N_4$), fluorine (FSG), phosphorus (PSG) and boron-doped silicon oxide glass (BPSG).

17. The method of claim 16, wherein the deposited dielectric is $SiO_2$.

18. The method of claim 17, wherein the deposition is conducted using process chemistry as follows:

| Gas | Flow Rate (sccm) |
|---|---|
| $SiH_4$ | 10–300 |
| $O_2$ | 20–1000 |
| He | 0–500 |
| $H_2$ | 0–5000. |

19. A method of filling gaps on a plurality of semiconductor wafers, the method comprising:
   providing a series of semiconductor wafers to a plasma reactor process chamber;
   filling a gap on each of the semiconductor wafers with a dielectric wherein the gap filling process comprises,
   (a) partially filling the gap with a dielectric using a high density plasma chemical vapor deposition process;
   (b) partially removing dielectric deposited in the gap from the gap opening by a plasma etch back process conducted with process chemistry comprising a fluorine (F)-containing etchant compound and hydrogen ($H_2$); and
   (c) further filling of the partially filled gap by a high density plasma chemical vapor deposition process; and
   wherein the wafer-to-wafer process repeatability is maintained.

20. The method of claim 19, wherein the etch is conducted using plasma process chemistry and reactor conditions as follows:

| | |
|---|---|
| Wafer temp (° C.) | 250–700 |
| $NF_3$ (sccm) | 50–1000 |
| $H_2$ (sccm) | 50–2000 |
| He (sccm) | 50–1000 |
| $O_2$ (sccm) | 0–500 |
| Pressure (mTorr) | 0.2–100 |
| Bias (HF RF) Power (W) | 0–5000 |
| Source (LF) Power (W). | 2000–8000 |

21. The method of claim 20, wherein the $H_2/NF_3$ gas flow ratio is from about 1:1 to about 15:1.

22. The method of claim 21, wherein the $H_2/NF_3$ gas flow ratio is about 5:1.

\* \* \* \* \*